(12) United States Patent
Lin et al.

(10) Patent No.: US 10,797,017 B2
(45) Date of Patent: Oct. 6, 2020

(54) EMBEDDED CHIP PACKAGE, MANUFACTURING METHOD THEREOF, AND PACKAGE-ON-PACKAGE STRUCTURE

(71) Applicant: Unimicron Technology Corp., Taoyuan (TW)

(72) Inventors: Po-Chen Lin, Kaohsiung (TW); Ra-Min Tain, Hsinchu County (TW); Chun-Hsien Chien, New Taipei (TW); Chien-Chou Chen, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/283,657

(22) Filed: Feb. 22, 2019

(65) Prior Publication Data

US 2019/0295984 A1  Sep. 26, 2019

Related U.S. Application Data

(63) Continuation-in-part of application No. 16/145,130, filed on Sep. 27, 2018.
(Continued)

(30) Foreign Application Priority Data

Jul. 27, 2018 (TW) .............................. 107126005 A
Dec. 6, 2018 (TW) .............................. 107143794 A

(51) Int. Cl.
*H01L 23/00* (2006.01)
*H01L 21/56* (2006.01)
*H01L 23/52* (2006.01)

(52) U.S. Cl.
CPC ............ *H01L 24/92* (2013.01); *H01L 21/568* (2013.01); *H01L 23/52* (2013.01); *H01L 24/24* (2013.01);
(Continued)

(58) Field of Classification Search
CPC ......... H01L 24/92; H01L 24/73; H01L 24/24; H01L 24/25; H01L 23/52; H01L 21/6835; H01L 21/568
See application file for complete search history.

(56) References Cited

U.S. PATENT DOCUMENTS 9,287,172 B2 * 3/2016 Yu ............................ H01L 23/15
9,583,472 B2 * 2/2017 Chung .................. H01L 21/565
(Continued)

FOREIGN PATENT DOCUMENTS

CN 101609830 12/2009
CN 103219306 7/2013
TW 201410089 3/2014

OTHER PUBLICATIONS

Office Action of U.S. Appl. No. 16/145,130, dated Feb. 5, 2020, pp. 1-23.
(Continued)

*Primary Examiner* — Earl N Taylor
(74) *Attorney, Agent, or Firm* — JCIPRNET

(57) ABSTRACT

An embedded chip package includes a circuit board, a chip, a dielectric material layer, and a build-up circuit structure. The circuit board includes a glass substrate and at least one conductive via. The glass substrate has a first surface, a second surface opposite the first surface, and a through-hole penetrating the glass substrate. The conductive via penetrates the glass substrate. The chip is disposed inside the through-hole. The dielectric material layer is filled inside the through-hole and covers the chip. The build-up circuit structure is disposed on the circuit board. The build-up circuit structure is electrically connected to the conductive via. A lower surface of the chip is exposed outside the dielectric material layer.

20 Claims, 8 Drawing Sheets

Related U.S. Application Data

(60) Provisional application No. 62/645,784, filed on Mar. 20, 2018.

(52) U.S. Cl.
CPC .............. *H01L 24/25* (2013.01); *H01L 24/73* (2013.01); *H01L 2224/24155* (2013.01); *H01L 2224/2518* (2013.01); *H01L 2224/32155* (2013.01); *H01L 2224/73209* (2013.01); *H01L 2224/73267* (2013.01); *H01L 2224/92244* (2013.01); *H01L 2924/3511* (2013.01)

(56) References Cited

U.S. PATENT DOCUMENTS

| | | | | |
|---|---|---|---|---|
| 9,793,217 | B2* | 10/2017 | Lee | H01L 23/5386 |
| 9,984,979 | B2* | 5/2018 | Park | H01L 24/19 |
| 10,163,773 | B1* | 12/2018 | Kapusta | H01L 23/49827 |
| 10,177,103 | B1* | 1/2019 | Yi | H01L 24/24 |
| 10,199,337 | B2* | 2/2019 | Park | H01L 23/5389 |
| 10,256,200 | B2* | 4/2019 | Park | H01L 24/00 |
| 10,262,949 | B2* | 4/2019 | Park | H01L 24/19 |
| 2005/0003652 | A1* | 1/2005 | Ramanathan | H01L 24/11 |
| | | | | 438/616 |
| 2009/0127686 | A1* | 5/2009 | Yang | H01L 24/82 |
| | | | | 257/686 |
| 2010/0006330 | A1* | 1/2010 | Fu | H01L 21/486 |
| | | | | 174/260 |
| 2011/0241218 | A1* | 10/2011 | Meyer | H01L 25/16 |
| | | | | 257/774 |
| 2012/0228754 | A1* | 9/2012 | Liu | H01L 23/13 |
| | | | | 257/676 |
| 2014/0070396 | A1* | 3/2014 | Kyozuka | H01L 24/19 |
| | | | | 257/698 |
| 2014/0291859 | A1* | 10/2014 | Kiwanami | H01L 23/485 |
| | | | | 257/774 |
| 2015/0062848 | A1* | 3/2015 | Lee | H05K 3/4697 |
| | | | | 361/761 |
| 2016/0027766 | A1* | 1/2016 | Chung | H01L 23/49811 |
| | | | | 438/107 |
| 2016/0081194 | A1* | 3/2016 | Sato | H05K 1/185 |
| | | | | 361/761 |
| 2016/0219713 | A1* | 7/2016 | Kim | H05K 1/186 |
| 2016/0338202 | A1* | 11/2016 | Park | H01L 23/5389 |
| 2017/0040265 | A1* | 2/2017 | Park | H01L 24/19 |
| 2017/0077047 | A1* | 3/2017 | Lee | H01L 21/56 |
| 2018/0145044 | A1* | 5/2018 | Park | H01L 24/00 |
| 2018/0226351 | A1* | 8/2018 | Park | H01L 24/19 |
| 2019/0295984 | A1* | 9/2019 | Lin | H01L 24/92 |

OTHER PUBLICATIONS

"Office Action of Taiwan Counterpart Application," dated Aug. 15, 2019, p. 1-p. 6.
"Office Action of China Related Application, application No. 201810842418.5", dated Jul. 2, 2020, p. 1-p. 10.

\* cited by examiner

EMBEDDED CHIP PACKAGE, MANUFACTURING METHOD THEREOF, AND PACKAGE-ON-PACKAGE STRUCTURE

CROSS-REFERENCE TO RELATED APPLICATION

This application is a continuation-in-part application of and claims the priority benefit of U.S. application Ser. No. 16/145,130, filed on Sep. 27, 2018, now pending. The prior U.S. application Ser. No. 16/145,130 claims the priority benefits of U.S. provisional application Ser. No. 62/645,784, filed on Mar. 20, 2018, and Taiwan application serial no. 107126005, filed on Jul. 27, 2018. This application also claims the priority benefit of Taiwan application serial no. 107143794, filed on Dec. 6, 2018. The entirety of each of the above-mentioned patent applications is hereby incorporated by reference herein and made a part of this specification.

BACKGROUND OF THE INVENTION

Field of the Invention

The invention is related to a chip package and a manufacturing method thereof and a package-on-package structure, and more particularly, to an embedded chip package and a manufacturing method thereof and a package-on-package structure.

Description of Related Art

Current chip packaging methods all require a layer of encapsulation to protect the chip, and then other circuits are added or packaging is performed in a two-dimensional orientation. The stacking and assembly at this time tend to cause greater warpage, thus affecting the yield of the package and subsequent reliability.

SUMMARY OF THE INVENTION

The invention provides an embedded chip package having better package yield and reliability.

The invention provides a package-on-package structure having the benefit that a stack structure and a circuit may be added.

The invention provides a manufacturing method of an embedded chip package to manufacture the above embedded chip package to alleviate the warpage issue generated by a build-up circuit or packaging.

An embedded chip package of the invention includes a circuit board, a chip, a dielectric material layer, and a build-up circuit structure. The circuit board includes a glass substrate and at least one conductive via. The glass substrate has a first surface, a second surface opposite the first surface, and a through-hole penetrating the glass substrate. The conductive via penetrates the glass substrate. The chip is disposed inside the through-hole. The dielectric material layer is filled inside the through-hole and covers the chip. The build-up circuit structure is disposed on the circuit board. The build-up circuit structure is electrically connected to the conductive via. A lower surface of the chip is exposed outside the dielectric material layer.

In an embodiment of the invention, the lower surface of the chip is level with the second surface of the glass substrate.

In an embodiment of the invention, the build-up circuit structure includes a first circuit layer, a first dielectric layer, a second circuit layer, and at least one first via. The first dielectric layer covers the first circuit layer. The second circuit layer and the first circuit layer are respectively located at two opposite sides of the first dielectric layer. The first via penetrates the first dielectric layer to be electrically connected to the first circuit layer and the second circuit layer.

In an embodiment of the invention, the build-up circuit structure above is disposed at the first surface of the glass substrate. The embedded chip package further includes a patterned conductive layer and a solder ball or a copper column. The patterned conductive layer is disposed at the second surface of the glass substrate such that the build-up circuit structure and the patterned conductive layer are respectively located at two opposite sides of the glass substrate. The solder ball or the copper column is disposed on the patterned conductive layer such that the solder ball or the copper column and the circuit board are respectively located at two opposite sides of the patterned conductive layer.

In an embodiment of the invention, the lower surface of the chip is an active surface. The active surface faces the patterned conductive layer and is electrically connected to the patterned conductive layer.

In an embodiment of the invention, the build-up circuit structure above is electrically connected to the patterned conductive layer via a conductive via.

In an embodiment of the invention, the build-up circuit structure above is disposed at the second surface of the glass substrate. The embedded chip package further includes a solder ball or a copper column. The solder ball or the copper column is disposed on the build-up circuit structure such that the solder ball or the copper column and the circuit board are respectively located at two opposite sides of the build-up circuit structure.

In an embodiment of the invention, the lower surface of the chip is an active surface. The active surface faces the build-up circuit structure and is electrically connected to the build-up circuit structure.

In an embodiment of the invention, the through-hole above is connected to the first surface and the second surface of the glass substrate.

A package-on-package structure of the invention includes a circuit board, at least one of the above embedded chip package (the build-up circuit structure is disposed at the first surface of the glass substrate) (hereinafter referred to as the first embedded chip package), and the above embedded chip package (the build-up circuit structure is disposed at the second surface of the glass substrate) (hereinafter referred to as the second embedded chip package). The first embedded chip package is disposed on the circuit board. The second embedded chip package is disposed on the first embedded chip package. In particular, the second embedded chip package and the circuit board are respectively located at two opposite sides of the first embedded chip package.

In an embodiment of the invention, the solder ball or the copper column of the second embedded chip package is electrically connected to the build-up circuit structure of the first embedded chip package. The solder ball or the copper column of the first embedded chip package is electrically connected to the circuit board.

A manufacturing method of an embedded chip package of the invention includes the following steps. First, a carrier and a release layer located on the carrier are provided. Next, a chip is disposed on the release layer. A circuit board is disposed on the release layer. In particular, the circuit board includes a glass substrate and at least one conductive via.

The glass substrate has a first surface, a second surface opposite the first surface, and a through-hole penetrating the glass substrate. The conductive via penetrates the glass substrate. A dielectric material layer is formed on the release layer after the chip and the circuit board are disposed on the release layer and the chip is embedded inside the through-hole. In particular, the dielectric material layer is filled inside the through-hole and covers the chip. Then, the release layer and the carrier are removed to expose the lower surface of the chip outside the dielectric material layer. A build-up circuit structure is formed on the circuit board after the release layer and the carrier are removed such that the build-up circuit structure is electrically connected to the conductive via.

In an embodiment of the invention, the build-up circuit structure above is disposed at the first surface of the glass substrate. The manufacturing method of an embedded chip package further includes the following steps. A patterned conductive layer is formed at the second surface of the glass substrate such that the build-up circuit structure and the patterned conductive layer are respectively located at two opposite sides of the glass substrate. A solder ball or a copper column is formed on the patterned conductive layer such that the solder ball or the copper column and the circuit board are respectively located at two opposite sides of the patterned conductive layer.

In an embodiment of the invention, the build-up circuit structure above is disposed at the second surface of the glass substrate. The manufacturing method of an embedded chip package further includes the following steps. A solder ball or a copper column is formed on the build-up circuit structure such that the solder ball or the copper column and the circuit board are respectively located at two opposite sides of the build-up circuit structure.

Based on the above, in the embedded chip package and the manufacturing method thereof and the package-on-package structure of the invention, the embedded chip package includes a circuit board, a chip, a dielectric material layer, and a build-up circuit structure. In particular, the circuit board includes a glass substrate and a conductive via, and the glass substrate has a through-hole penetrating the glass substrate. Next, the chip is disposed in the through-hole, the dielectric material layer is filled inside the through-hole, and the build-up circuit structure is disposed on the circuit board. Via this design, the manufacturing method of the embedded chip package of the invention may alleviate the warping issue caused by a build-up circuit or packaging, so that the embedded chip package of the invention has better package yield and reliability and the package-on-package structure of the invention has the benefit that a stack structure and a circuit may be added.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
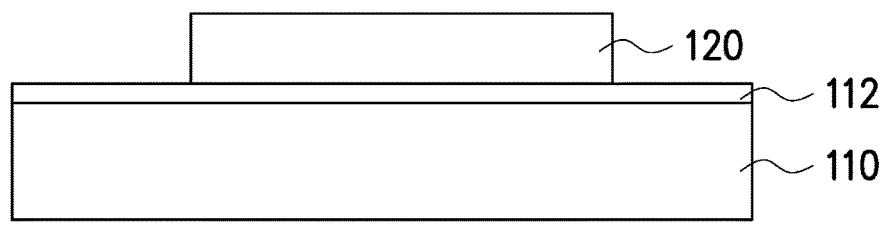
FIG. 1A to FIG. 1F show cross sections of a manufacturing method of an embedded chip package according to an embodiment of the invention.

The foregoing and other technical contents, features, and effects of the invention are intended to be described more comprehensively in each of the following embodiments accompanied with figures. In the following embodiments, terms used to indicate direction such as "up", "down", "front", "back", "left", and "right", merely refer to directions in the accompanying figures. Therefore, the directional terms are used to illustrate and are not intended to limit the invention.

In the detailed description of each embodiment, the terms "first", "second", "third", "fourth" and the like may be used to describe different elements. These terms are only used to distinguish elements from one another, but in a structure, these elements should not be limited by these terms. For example, a first element may be termed a second element, and, similarly, a second element may be termed a first element without departing from the scope of the invention. In addition, in the manufacturing method, the forming order of these elements or components should not be limited by these terms except for a specific process flow. For example, the first element may be formed before the second element. Alternatively, the first element may be formed after the second element. Or, the first element and the second element may be formed in the same process or step.

Moreover, the thicknesses of the layers and regions in the figures are enlarged for clarity. The same or similar reference numerals represent the same or similar elements and are not repeated in the following paragraphs.

FIG. 1A to FIG. 1F show cross sections of a manufacturing method of an embedded chip package according to an embodiment of the invention. FIG. 1G shows a bottom view of the embedded chip package of FIG. 1F. For the sake of clarity and convenience of description, a patterned conductive layer 160 and solder balls 170 are omitted from FIG. 1G.

Referring to FIG. 1A, a carrier 110 and a release layer 112 disposed on the carrier 110 are provided first, and then a chip 120 is disposed on the release layer 112. In the present embodiment, the carrier 110 may be a metal substrate, a silicon substrate, a glass substrate, a ceramic substrate, or other suitable carriers that may be used for support. The release layer 112 may be formed by a polymer-based material, and the polymer-based material may be removed together with the carrier 110 in a subsequent step. In some embodiments, the release layer 112 is an epoxy resin-based heat release material that loses its adhesive properties when heated, such as a light-to-heat-conversion (LTHC) release coating. In other embodiments, the release layer 112 may be an ultraviolet (UV) adhesive that loses its adhesive properties when exposed to UV. The release layer 112 may be dispensed and cured as a liquid, and the release layer 112 may be a laminate film laminated on the carrier 110, or may be in other forms.

Figure 1B:
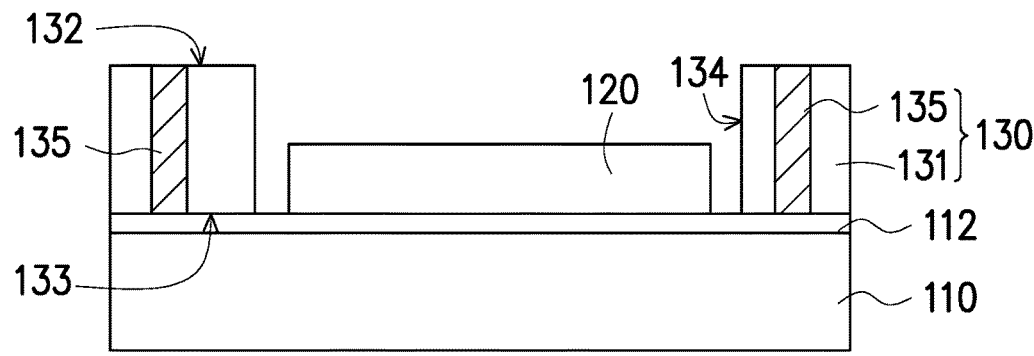

Referring to FIG. 1B, a circuit board 130 is disposed on the release layer 112. In the present embodiment, the circuit board 130 includes a glass substrate 131 and at least one conductive via 135. In particular, the glass substrate 131 has a first surface 132, a second surface 133 opposite the first surface 132, and a through-hole 134 penetrating the glass substrate 131. In some embodiments, the through-hole 134 is connected to the first surface 132 and the second surface 133 of the glass substrate 131.

Then, the conductive via 135 may be formed by the following steps, but is not limited thereto. First, the glass substrate 131 is drilled by laser or machine processing to form a via penetrating the glass substrate 131. In particular, the via is connected to the first surface 132 and the second surface 133. Then, a seed layer (not shown) is formed inside the via, and a conductive material (not shown) is formed inside the via by electroplating, thereby forming the conductive via 135 penetrating the glass substrate 131. Here, the conductive material may be a metal or a metal alloy such as copper, titanium, tungsten, aluminum, or the like, or a combination thereof.

It should be noted that, in the present embodiment, although the chip 120 is disposed on the release layer 112 first and then the circuit board 130 is disposed on the release layer 112, and the through-hole 134 of the circuit board 130 is aligned with the chip 120 such that the chip 120 is embedded inside the through-hole 134 of the circuit board 130, the invention is not limited thereto. That is, in other embodiments, the circuit board 130 may be disposed on the release layer 112 first, and then the chip 120 is disposed on the release layer 112 and the chip 120 is embedded inside the through-hole 134 of the circuit board 130.

In addition, in the present embodiment, the thickness of the circuit board 130 may be the same as or different from the thickness of the chip 120, and is not limited in the invention. In addition, although the sizes of through-hole 134 and chip 120 are not limited in the present embodiment, it should be noted that the cross-sectional area of the through-hole 134 of the circuit board 130 needs to be greater than the cross-sectional area of the chip 120, so that the chip 120 is suitably embedded inside the through-hole 134 of the circuit board 130.

Figure 1C:
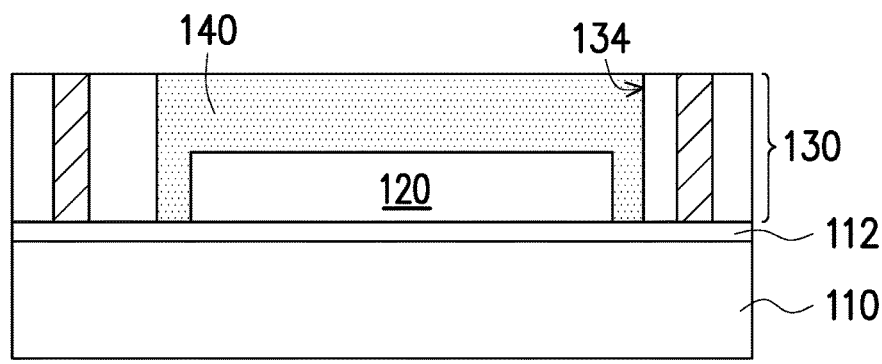

Next, referring to FIG. 1C, after the chip 120 and the circuit board 130 are disposed on the release layer 112 and the chip 120 is embedded inside the through-hole 134, a dielectric material layer 140 is formed on the release layer 112 such that the dielectric material layer 140 is filled inside through-hole 134 and covers the chip 120. In the present embodiment, for example, a resin (e.g., epoxy resin), silane (e.g., hexamethyldisiloxane; HMDSN), tetraethoxysilane (TEOS), bis(dimethylamino)dimethylsilane (BDMADMS), or other suitable dielectric materials is coated on the release layer 112 and cured to form the dielectric material layer 140. Thus, the dielectric material layer 140 may be filled inside the through-hole 134 and located between the chip 120 and the circuit board 130 such that the buffering between the chip 120 and the circuit board 130 is good.

Figure 1D:
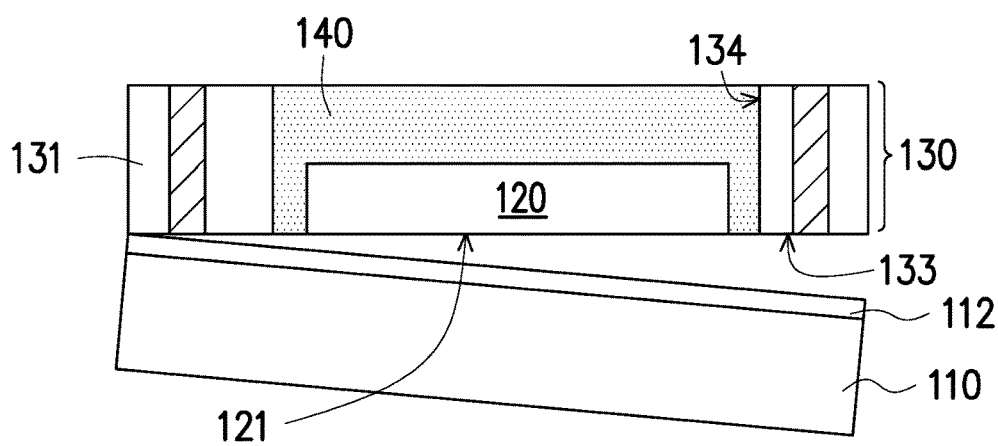

Referring to FIG. 1D, after the dielectric material layer 140 is formed, the release layer 112 and the carrier 110 are removed to expose the lower surface 121 of the chip 120 outside the dielectric material layer 140. In some embodiments, the lower surface 121 of the chip 120 is exposed outside the through-hole 134 of the circuit board 130. Moreover, since both the circuit board 130 and the chip 120 are disposed on the release layer 112 and in contact with the release layer 112, the lower surface 121 of the chip 120 may be level with the second surface 133 of the glass substrate 131.

Figure 1E:
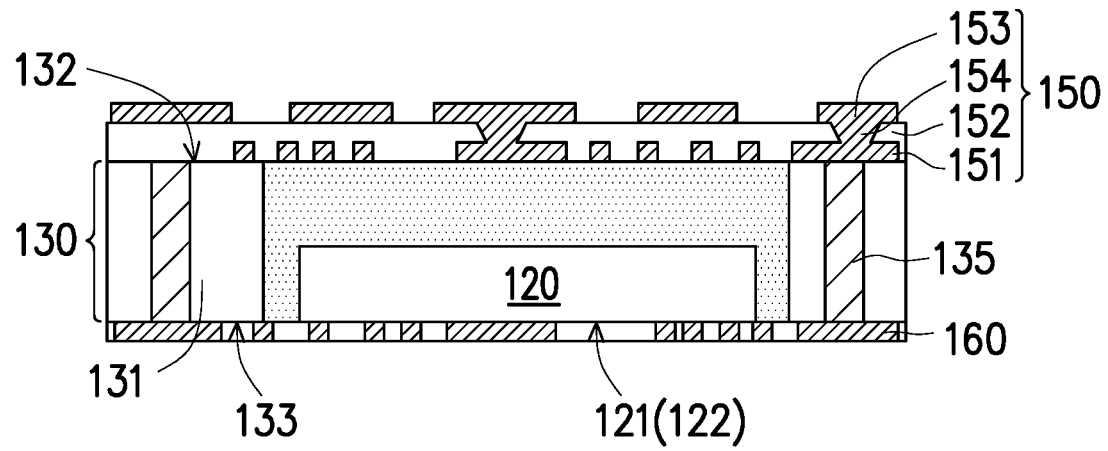

Referring to FIG. 1E, after the release layer 112 and the carrier 110 are removed, a build-up circuit structure 150 is formed on the circuit board 130, and a patterned conductive layer 160 is formed on the circuit board 130. In particular, the build-up circuit structure 150 may be electrically connected to the conductive via 135, the patterned conductive layer 160 may be electrically connected to the conductive via 135, and the patterned conductive layer 160 may be electrically connected to the chip 120. Therefore, the build-up circuit structure 150 may be electrically connected to the patterned conductive layer 160 via the conductive via 135. For example, the build-up circuit structure 150 includes a first circuit layer 151, a first dielectric layer 152, a second circuit layer 153, and at least one first via 154. The first circuit layer 151 covers the first surface 132 of the glass substrate 131, and the first dielectric layer 152 covers the first circuit layer 151 and the first surface 132 of the glass substrate 131. The first via 154 penetrates the first dielectric layer 152 to be electrically connected to the first circuit layer 151 and the second circuit layer 153. In particular, the second circuit layer 153 and the first circuit layer 151 are respectively located at two opposite sides of the first dielectric layer 152.

Further, in the present embodiment, since the build-up circuit structure 150 is formed at the first surface 132 of the glass substrate 131, the patterned conductive layer 160 is formed at the second surface 133 of the glass substrate 131, so that the build-up circuit structure 150 and the patterned conductive layers 160 are respectively located at two opposite sides of the glass substrate 131.

In addition, in the present embodiment, the lower surface 121 of the chip 120 may be used as an active surface 122. In particular, the active surface 122 faces the patterned conductive layer 160 and the active surface 122 may be electrically connected to the patterned conductive layer 160.

Figure 1F:
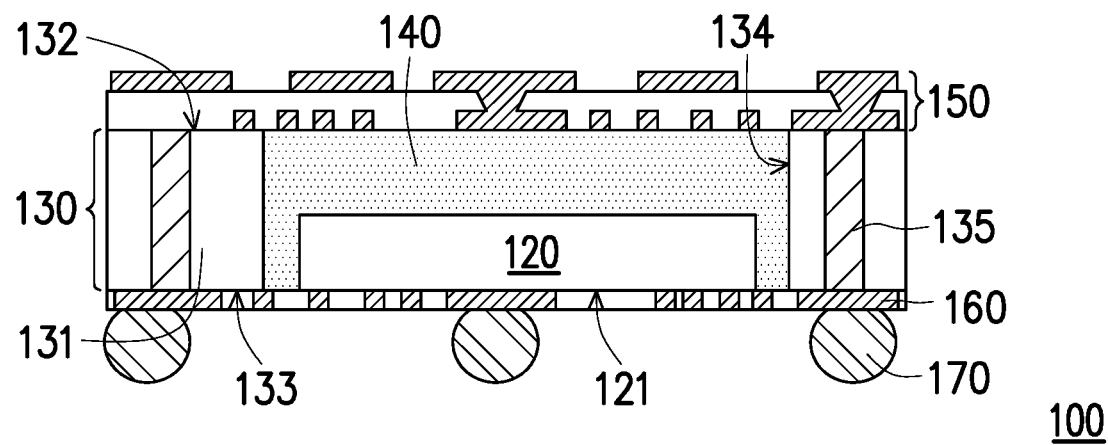
Figure 1G:
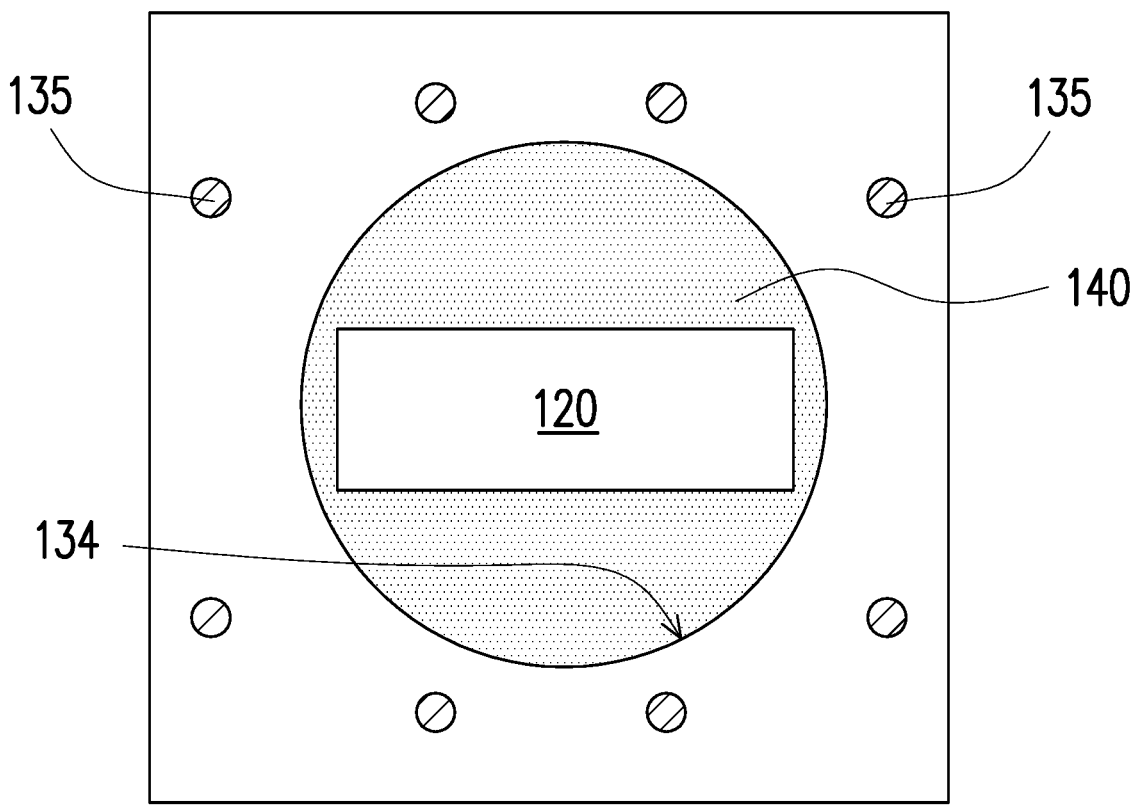
FIG. 1G shows a bottom view of the embedded chip package of FIG. 1F.

Next, in order to electrically connect the embedded chip package 100 of the present embodiment to the outside thereof, conductive connecting members may be formed on the patterned conductive layer 160. In the present embodiment, the conductive connecting members may be, for example, solder balls 170, but are not limited thereto. Referring to FIG. 1F, the solder balls 170 are formed on the patterned conductive layer 160 such that the solder balls 170 and the circuit board 130 are respectively located at two opposite sides of the patterned conductive layer 160. At this time, the embedded chip package 100 of the present embodiment is largely completed.

In addition, referring to FIG. 1G, in the present embodiment, the shape of the through-hole 134 may be a circle, but is not limited thereto. That is to say, in other embodiments, the shape of the through-hole may also be square or other suitable shapes as long as the chip may be embedded inside the through-hole of the circuit board.

In short, an embedded chip package 100 of the present embodiment includes a circuit board 130, a chip 120, a dielectric material layer 140, and a build-up circuit structure 150. The circuit board 130 includes a glass substrate 131 and at least one conductive via 135. The glass substrate 131 has a first surface 132, a second surface 133 opposite the first surface 132, and a through-hole 134 penetrating the glass substrate 131. The conductive via 135 penetrates the glass substrate 131. The chip 120 is disposed inside the through-hole 134. The dielectric material layer 140 is filled inside the through-hole 134 and covers the chip 120. The build-up circuit structure 150 is disposed on the circuit board 130. The build-up circuit structure 150 is electrically connected to the conductive via 135. The lower surface 121 of the chip 120 is exposed outside the dielectric material layer 140. Via this design, the manufacturing method of the embedded chip package 100 of the present embodiment may alleviate the warping issue generated by the build-up circuit structure 150 or packaging and provide the embedded chip package 100 of the present embodiment with better package yield and reliability.

Additional embodiments are discussed below. It should be mentioned that, the embodiments below use the same device reference numerals and portions of the content from previous embodiments. Specifically, the same reference numerals are used to represent the same or similar devices, and the descriptions for the same techniques are omitted. The omitted portions are as described in the embodiments above and are not repeated in the embodiments below.

Figure 1H:
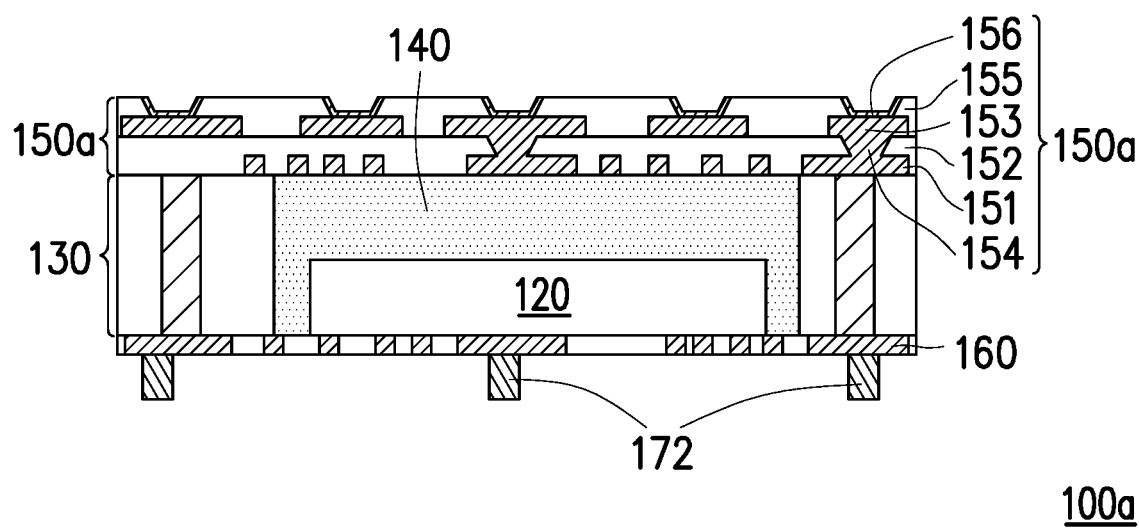
FIG. 1H shows a cross section of an embedded chip package of another embodiment of the invention.

FIG. 1H shows a cross section of an embedded chip package of another embodiment of the invention. Referring to FIG. 1F and FIG. 1H simultaneously, an embedded chip package 100a of the present embodiment is similar to the embedded chip package 100 of FIG. 1F, but the main difference between the two is that the conductive connecting members of the embedded chip package 100a of the present embodiment are copper columns 172, and a build-up circuit structure 150a further includes a second dielectric layer 155 and a second via 156. Specifically, in the manufacturing method of the embedded chip package 100a of the present embodiment, after the manufacturing steps of FIG. 1A to FIG. 1D, the step of FIG. 1H is performed to form the build-up circuit structure 150a on the circuit board 130, and a patterned conductive layer 160 is formed on the circuit board 130. In particular, the build-up circuit structure 150a further includes the second dielectric layer 155 and the second via 156. The second dielectric layer 155 covers the second circuit layer 153 and the first dielectric layer 152. The second via 156 penetrates the second dielectric layer 155 to be electrically connected to the second circuit layer 153. Next, referring to FIG. 1H, the copper columns 172 are formed on the patterned conductive layer 160 such that the copper columns 172 and the circuit board 130 are respectively located at two opposite sides of the patterned conductive layer 160.

Figure 2A:
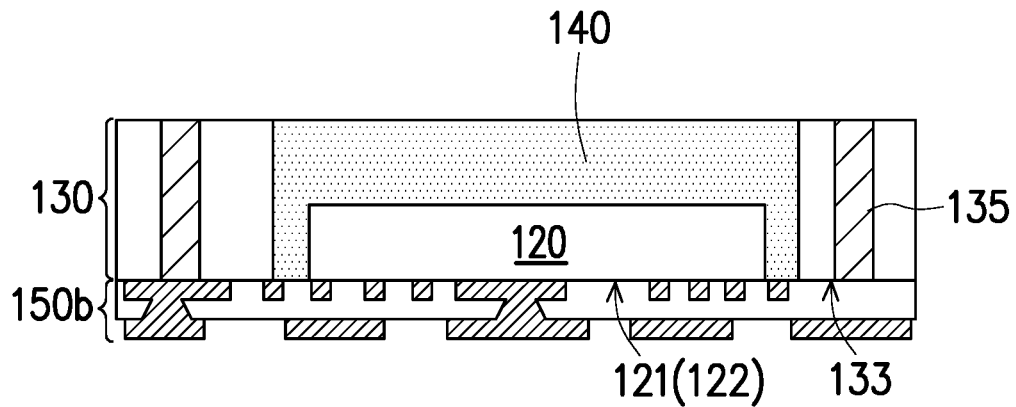
FIG. 2A to FIG. 2B show cross sections of a manufacturing method of an embedded chip package according to another embodiment of the invention.
Figure 2B:
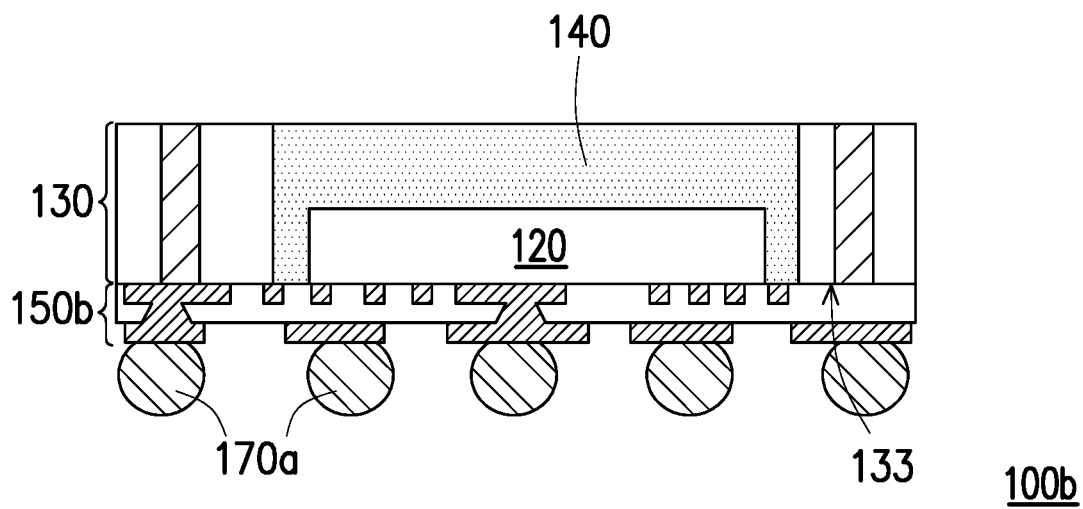

FIG. 2A to FIG. 2B show cross sections of a manufacturing method of an embedded chip package according to another embodiment of the invention. The difference between the embodiment shown in FIG. 2A to FIG. 2B and the embodiment shown in FIG. 1A to FIG. 1F is the position of a build-up circuit structure 150b of an embedded chip package 100b of the present embodiment and the relative relationship of the active surface 122 and the build-up circuit structure 150b. In addition, the embedded chip package 100b of the present embodiment does not include a patterned conductive layer.

Specifically, in the manufacturing method of the embedded chip package 100b of the present embodiment, after the manufacturing steps of FIG. 1A to FIG. 1D are performed, the step of FIG. 2A is performed to form the build-up circuit structure 150b on the circuit board 130. At this time, the build-up circuit structure 150b is disposed on the second surface 133 of the glass substrate 110, and the build-up circuit structure 150b may be electrically connected to the conductive via 135. In the present embodiment, the lower surface 121 of the chip 120 may be used as the active surface 122. In particular, the active surface 122 faces the build-up circuit structure 150b, and the active surface 122 may be electrically connected to the build-up circuit structure 150b.

Then, referring to FIG. 2B, solder balls 170a are formed on the build-up circuit structure 150b such that the solder balls 170a and the circuit board 130 are respectively located at two opposite sides of the build-up circuit structure 150b. At this time, the embedded chip package 100b of the present embodiment is largely completed.

Figure 2C:
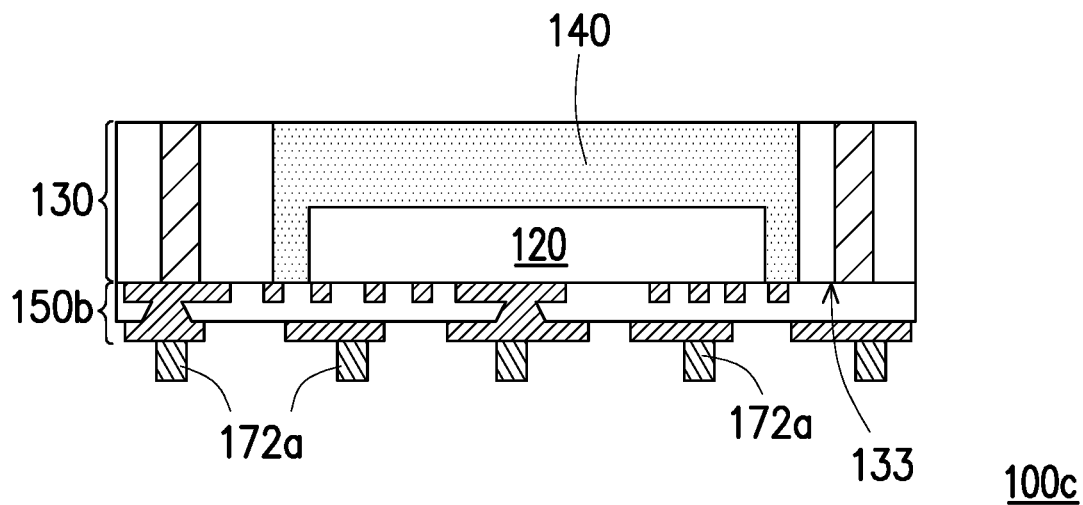
FIG. 2C shows a cross section of an embedded chip package of another embodiment of the invention.

Although the solder balls 170a are formed on the build-up circuit structure 150b in FIG. 2B, the invention is not limited thereto. That is, in other embodiments, as shown in FIG. 2C, copper columns 172a may also be formed on the build-up circuit structure 150b to manufacture an embedded chip package 100c of another embodiment.

Figure 3A:
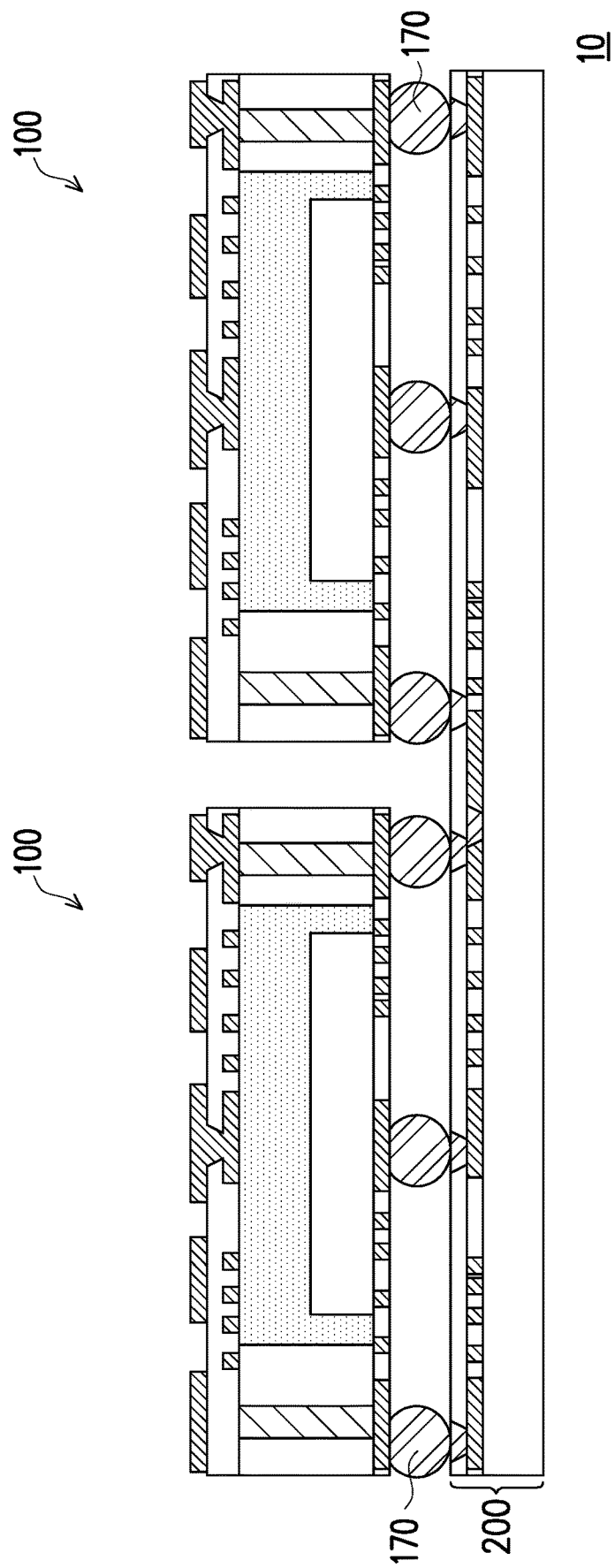
FIG. 3A to FIG. 3B show cross sections of side-by-side package structures of various embodiments of the invention.
Figure 3B:
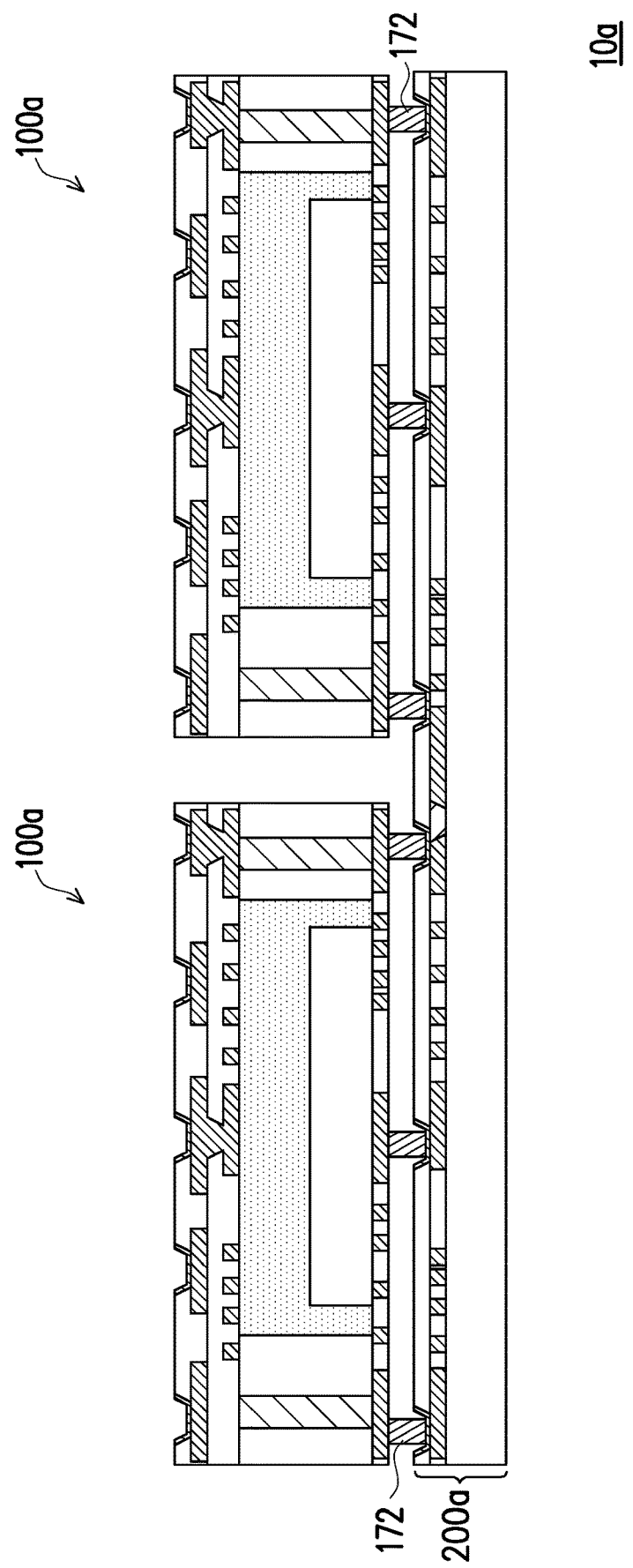

FIG. 3A to FIG. 3B show cross sections of side-by-side package structures of various embodiments of the invention. In a side-by-side package structure, the embedded chip package 100 or the embedded chip package 100a manufactured in the above manner is disposed side-by-side on the circuit boards 200 and 200a. Referring to FIG. 3A, in the side-by-side package structure 10 of the present embodiment, 2 of the embedded chip package 100 are schematically disposed on the circuit board 200. In particular, the 2 embedded chip packages 100 may be electrically connected to the circuit board 200 via the solder balls 170 thereof. Referring to FIG. 3B, in the side-by-side package structure 10a of the present embodiment, 2 of the embedded chip package 100a are schematically disposed on the circuit board 200a. In particular, the 2 embedded chip packages 100a may both be electrically connected to the circuit board 200a via the copper columns 172 thereof.

It should be noted that although in FIG. 3A (or FIG. 3B), 2 of the embedded chip package 100 (or the embedded chip package 100a) are schematically disposed on the circuit board 200 (or the circuit board 200a), the invention does not limit the number of the embedded chip package 100 (or the embedded chip package 100a) in the side-by-side package structure. That is to say, in other embodiments not shown, 2 or more of the embedded chip package 100 (or the embedded chip package 100a) may be disposed on the circuit board 200 (or the circuit board 200a) to form different side-by-side package structures.

Figure 4A:
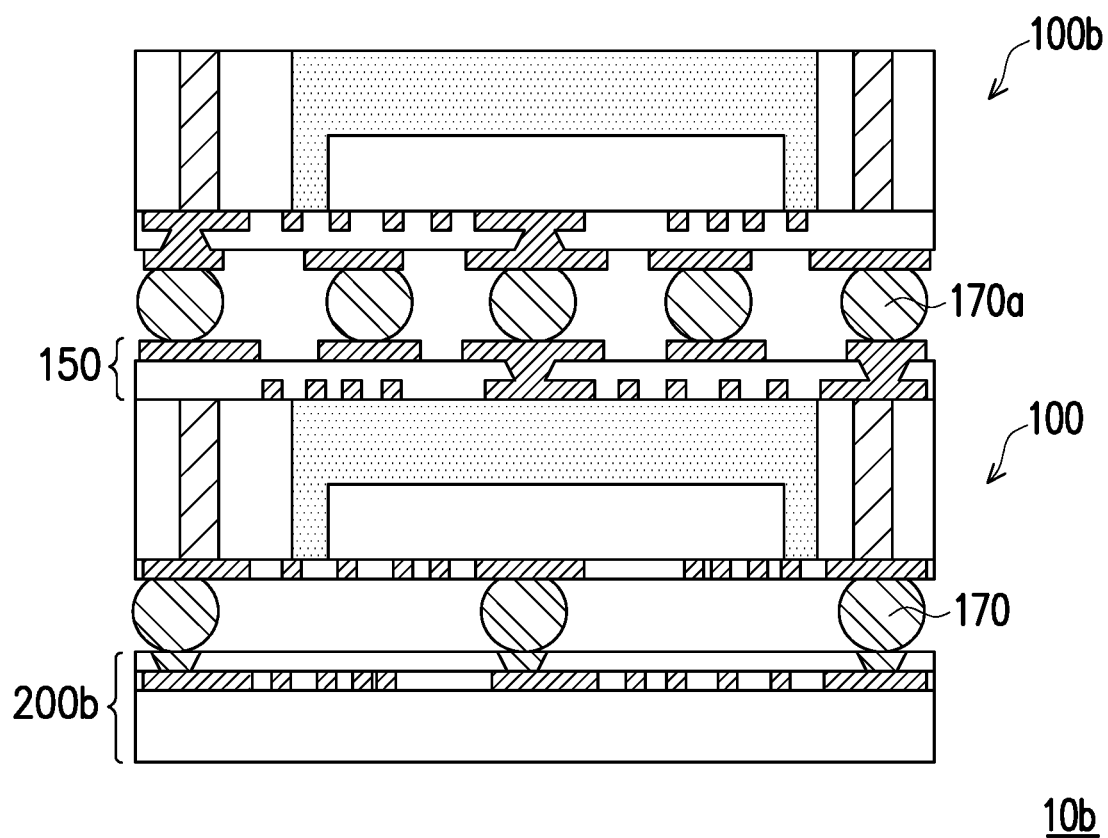
FIG. 4A to FIG. 4B show cross sections of package-on-package structures of various embodiments of the invention.
Figure 4B:
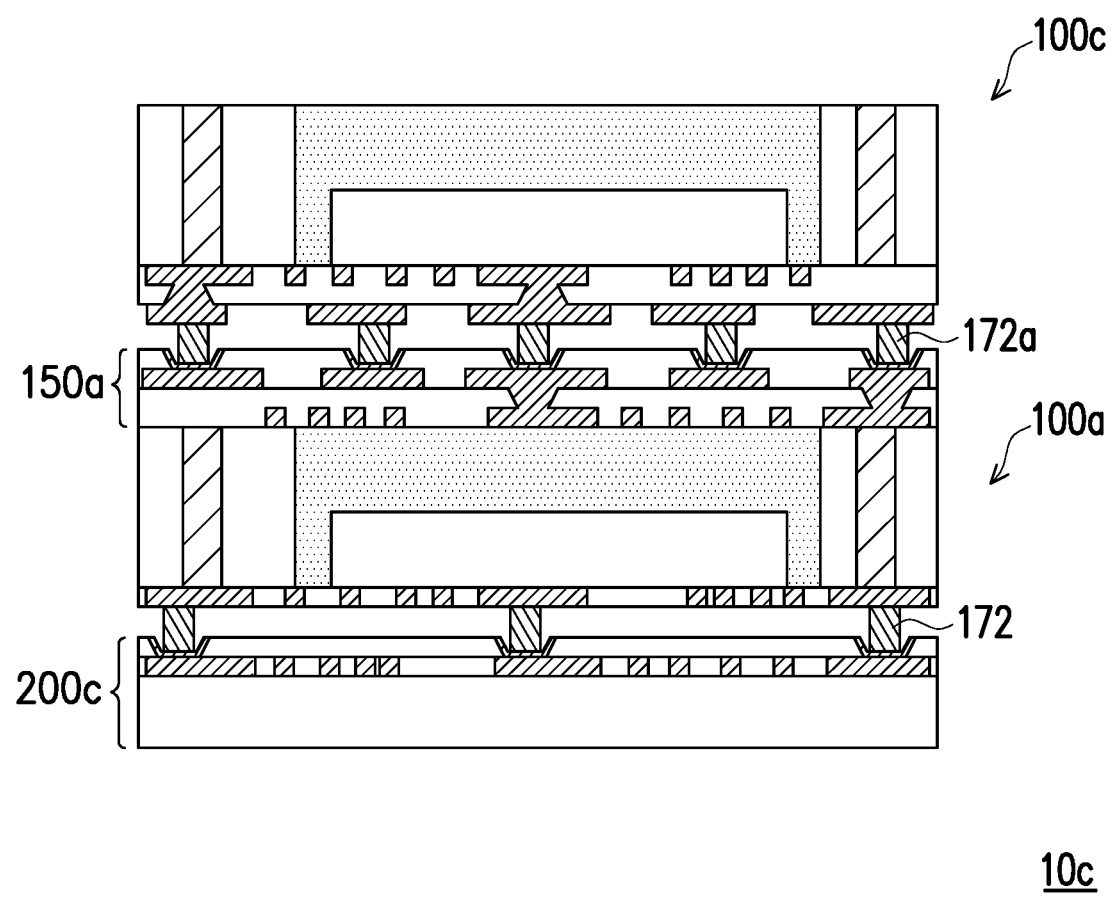

FIG. 4A to FIG. 4B show cross sections of package-on-package structures of various embodiments of the invention. A package-on-package structure is formed by disposing the embedded chip package 100, the embedded chip package 100a, the embedded chip package 100b, or the embedded chip package 100c manufactured above, or a combination thereof on circuit boards 200b and 200c by stacking. Referring to FIG. 4A, in the package-on-package structure 10b of the present embodiment, 1 of the embedded chip package 100 is schematically disposed on the circuit board 200b, and 1 of the embedded chip package 100b is disposed on the embedded chip package 100. In particular, the embedded chip package 100b and the circuit board 200b are respectively located at two opposite sides of the embedded chip package 100. In addition, the solder balls 170a of the embedded chip package 100b may be electrically connected to the build-up circuit structure 150 of the embedded chip package 100. The solder balls 170 of the embedded chip package 100 are electrically connected to the circuit board 200b.

Referring to FIG. 4B, in the package-on-package structure 10c of the present embodiment, 1 of the embedded chip package 100a is schematically disposed on the circuit board 200c, and 1 of the embedded chip package 100c is disposed on the embedded chip package 100a. In particular, the embedded chip package 100c and the circuit board 200c are respectively located at two opposite sides of the embedded chip package 100a. In addition, the copper columns 172a of the embedded chip package 100c may be electrically connected to the build-up circuit structure 150a of the embedded chip package 100a. The copper columns 172 of the embedded chip package 100a may be electrically connected to the circuit board 200c.

It should be noted that although in FIG. 4A (or FIG. 4B), 1 of the embedded chip package 100 (or the embedded chip package 100a) is schematically disposed between the embedded chip package 100b (or the embedded chip package 100c) and the circuit board 200b (or the circuit board 200c), the invention does not limit the number of the embedded chip package 100 (or the embedded chip package 100a) in the package-on-package structure. That is to say, in other embodiments not shown, 1 or more of the embedded chip package 100 (or the embedded chip package 100a) may be disposed between the embedded chip package 100b (or the embedded chip package 100c) and the circuit board 200b (or the circuit board 200c) to form a package-on-package structure having a plurality of laminations. In other words, the package-on-package structures 10b and 10c of the present embodiment have the benefit that a stack structure and a circuit may be added.

Based on the above, in the embedded chip package and the manufacturing method thereof and the package-on-package structure of the invention, the embedded chip package includes a circuit board, a chip, a dielectric material layer, and a build-up circuit structure. In particular, the circuit board includes a glass substrate and a conductive via, and the glass substrate has a through-hole penetrating the glass substrate. Next, the chip is placed in the through-hole, the dielectric material layer is filled inside the through-hole, and the build-up circuit structure is disposed on the circuit board. Via this design, the manufacturing method of the embedded chip package of the invention may alleviate the warping issue caused by a build-up circuit or packaging, so that the embedded chip package of the invention has better package yield and reliability and the package-on-package structure of the invention has the benefit that a stack structure and a circuit may be added.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:
1. An embedded chip package, comprising:
a circuit board, comprising:
a glass substrate having a first surface, a second surface opposite the first surface, and a through-hole penetrating the glass substrate; and
at least one conductive via penetrating the glass substrate;
a chip disposed inside the through-hole;
a dielectric material layer filled inside the through-hole and covering the chip; and
a build-up circuit structure disposed on the circuit board, wherein the build-up circuit structure is electrically connected to the conductive via, a lower surface of the chip is exposed outside the dielectric material layer, and the lower surface of the chip is an active surface.

2. The embedded chip package of claim 1, wherein the lower surface of the chip is level with the second surface of the glass substrate.

3. The embedded chip package of claim 1, wherein the build-up circuit structure comprises:
a first circuit layer;
a first dielectric layer covering the first circuit layer;
a second circuit layer, wherein the second circuit layer and the first circuit layer are respectively located at two opposite sides of the first dielectric layer; and
at least one first via penetrating the first dielectric layer to be electrically connected to the first circuit layer and the second circuit layer.

4. The embedded chip package of claim 1, wherein the build-up circuit structure is disposed at the first surface of the glass substrate, and the embedded chip package further comprises:
a patterned conductive layer disposed at the second surface of the glass substrate such that the build-up circuit structure and the patterned conductive layer are respectively located at two opposite sides of the glass substrate; and
a solder ball or a copper column disposed on the patterned conductive layer such that the solder ball or the copper column and the circuit board are respectively located at two opposite sides of the patterned conductive layer.

5. The embedded chip package of claim 4, wherein the active surface faces the patterned conductive layer and is electrically connected to the patterned conductive layer.

6. The embedded chip package of claim 4, wherein the build-up circuit structure is electrically connected to the patterned conductive layer via the conductive via.

7. The embedded chip package of claim 1, wherein the build-up circuit structure is disposed at the second surface of the glass substrate, and the embedded chip package further comprises:
a solder ball or a copper column disposed on the build-up circuit structure such that the solder ball or the copper column and the circuit board are respectively located at two opposite sides of the build-up circuit structure.

8. The embedded chip package of claim 7, wherein the active surface faces the build-up circuit structure and is electrically connected to the build-up circuit structure.

9. The embedded chip package of claim 1, wherein the through-hole is connected to the first surface and the second surface of the glass substrate.

10. A package-on-package structure, comprising:
a first circuit board;
at least one first embedded chip package disposed on the first circuit board comprises the embedded chip package of claim 4; and
a second embedded chip package disposed on the first embedded chip package, comprising:
a second circuit board, comprising: a second glass substrate having a third surface, a fourth surface opposite the third surface, and a second through-hole penetrating the second glass substrate; and at least one second conductive via penetrating the second glass substrate;
a second chip disposed inside the second through-hole;
a second dielectric material layer filled inside the second through-hole and covering the second chip;
a second build-up circuit structure disposed on the second circuit board, wherein the second build-up circuit structure is electrically connected to the second conductive via, a lower surface of the second chip is exposed outside the second dielectric material layer, and the second build-up circuit structure is disposed at the fourth surface of the second glass substrate; and a second solder ball or a second copper column disposed on the second build-up circuit structure such that the second solder ball or the second copper column and the second circuit board are respectively located at two opposite sides of the second build-up circuit structure, wherein the second embedded chip package and the first circuit board are respectively located at two opposite sides of the first embedded chip package.

11. The package-on-package structure of claim 10, wherein the second solder ball or the second copper column of the second embedded chip package is electrically connected to the build-up circuit structure of the first embedded chip package, and the solder ball or the copper column of the first embedded chip package is electrically connected to the first circuit board.

12. A manufacturing method of an embedded chip package, comprising:

providing a carrier and a release layer disposed on the carrier;

disposing a chip on the release layer;

disposing a circuit board on the release layer, the circuit board comprising:
  a glass substrate having a first surface, a second surface opposite the first surface, and a through-hole penetrating the glass substrate; and
  at least one conductive via penetrating the glass substrate;

forming a dielectric material layer on the release layer after the chip and the circuit board are disposed on the release layer and the chip is embedded inside the through-hole, wherein the dielectric material layer is filled inside the through-hole and covers the chip;

removing the release layer and the carrier to expose a lower surface of the chip outside the dielectric material layer; and forming a build-up circuit structure on the circuit board after the release layer and the carrier are removed such that the build-up circuit structure is electrically connected to the conductive via.

13. The manufacturing method of the embedded chip package of claim 12, wherein the lower surface of the chip is level with the second surface of the glass substrate.

14. The manufacturing method of the embedded chip package of claim 12, wherein the build-up circuit structure comprises:
a first circuit layer;
a first dielectric layer covering the first circuit layer;
a second circuit layer, wherein the second circuit layer and the first circuit layer are respectively located at two opposite sides of the first dielectric layer; and
at least one first via penetrating the first dielectric layer to be electrically connected to the first circuit layer and the second circuit layer.

15. The manufacturing method of the embedded chip package of claim 12, wherein the build-up circuit structure is disposed at the first surface of the glass substrate, and the manufacturing method of the embedded chip package further comprises:

forming a patterned conductive layer on the second surface of the glass substrate such that the build-up circuit structure and the patterned conductive layer are respectively located at two opposite sides of the glass substrate; and forming a solder ball or a copper column on the patterned conductive layer such that the solder ball or the copper column and the circuit board are respectively located at two opposite sides of the patterned conductive layer.

16. The manufacturing method of the embedded chip package of claim 15, wherein the lower surface of the chip is an active surface, and the active surface faces the patterned conductive layer and is electrically connected to the patterned conductive layer.

17. The manufacturing method of the embedded chip package of claim 15, wherein the build-up circuit structure is electrically connected to the patterned conductive layer via the conductive via.

18. The manufacturing method of the embedded chip package of claim 12, wherein the build-up circuit structure is disposed at the second surface of the glass substrate, and the manufacturing method of the embedded chip package further comprises:

forming a solder ball or a copper column on the build-up circuit structure such that the solder ball or the copper column and the circuit board are respectively located at two opposite sides of the build-up circuit structure.

19. The manufacturing method of the embedded chip package of claim 18, wherein the lower surface of the chip is an active surface, and the active surface faces the build-up circuit structure and is electrically connected to the build-up circuit structure.

20. The manufacturing method of the embedded chip package of claim 12, wherein the through-hole is connected to the first surface and the second surface of the glass substrate.

* * * * *